United States Patent
Xiang et al.

(12) 
(10) Patent No.: US 6,271,132 B1
(45) Date of Patent: Aug. 7, 2001

(54) SELF-ALIGNED SOURCE AND DRAIN EXTENSIONS FABRICATED IN A DAMASCENE CONTACT AND GATE PROCESS

(75) Inventors: Qi Xiang, Santa Clara; Matthew S. Buynoski, Palo Alto; Ming-Ren Lin, Cupertino, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/303,693

(22) Filed: May 3, 1999

(51) Int. Cl.[7] .................................................. H01L 21/44
(52) U.S. Cl. ......................... 438/682; 438/663; 438/633
(58) Field of Search ................................. 438/682, 663, 438/633, 669, 670

(56) References Cited

U.S. PATENT DOCUMENTS

| | | |
|---|---|---|
| 4,683,645 | 8/1987 | Naguib et al. . |
| 4,745,082 | 5/1988 | Kwok . |
| 4,784,718 | 11/1988 | Mitani et al. . |
| 4,792,531 | * 12/1988 | Kakihana . |
| 5,264,382 | 11/1993 | Watanabe . |
| 5,374,575 | 12/1994 | Kim et al. . |
| 5,391,510 | 2/1995 | Hsu et al. . |
| 5,393,685 | 2/1995 | Yoo et al. . |
| 5,429,956 | 7/1995 | Shell et al. . |
| 5,593,907 | 1/1997 | Anjum et al. . |
| 5,607,884 | 3/1997 | Byun . |
| 5,675,159 | 10/1997 | Oku et al. . |
| 5,716,861 | 2/1998 | Moslehi . |
| 5,793,090 | 8/1998 | Gardner et al. . |
| 5,811,323 | 9/1998 | Miyasaka et al. . |
| 5,825,066 | 10/1998 | Buynoski . |
| 5,856,225 | 1/1999 | Lee et al. . |
| 5,858,843 | 1/1999 | Doyle et al. . |
| 5,960,270 | * 9/1999 | Misra et al. .......................... 438/197 |
| 6,117,715 | * 9/2000 | Ha ....................................... 438/197 |

FOREIGN PATENT DOCUMENTS

| | | |
|---|---|---|
| 3-248433 | 11/1991 | (JP) . |
| 4-123439 | 4/1992 | (JP) . |
| 5-160396 | 6/1993 | (JP) . |

OTHER PUBLICATIONS

Saito, et al. "Plasma–damage–free gate process using chemical mechanical processing for 1 um MOSFETs" Jpn. J. Appl. Phys. vol. 38, pp. 227–2231, Apr. 1999.*

"Low–Dielectric–Constant Materials for ULSI Interlayer–Dielectric Applications", Wei William Lee, MRS Bulletin Oct. 1997.

"Sub–100nm Gate Length Metal Gate NMOS Transistors Fabricated by a Replacement Gate Process", A. Chatterjee, International Electronic Devices Meeting, 1997, Washington DC, Dec. 7–10, 1997.

* cited by examiner

Primary Examiner—Matthew Smith
(74) Attorney, Agent, or Firm—Foley & Lardner

(57) ABSTRACT

A method of fabricating a transistor having shallow source and drain extensions utilizes a self-aligned contact. The drain extensions are provided through an opening between a contact area and the gate structure. A high-k gate dielectric material can be utilized. P-MOS and N-MOS transistors can be created according to the disclosed method.

20 Claims, 6 Drawing Sheets

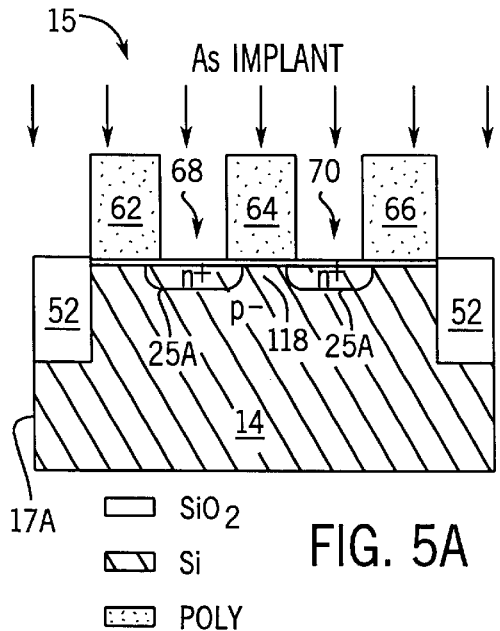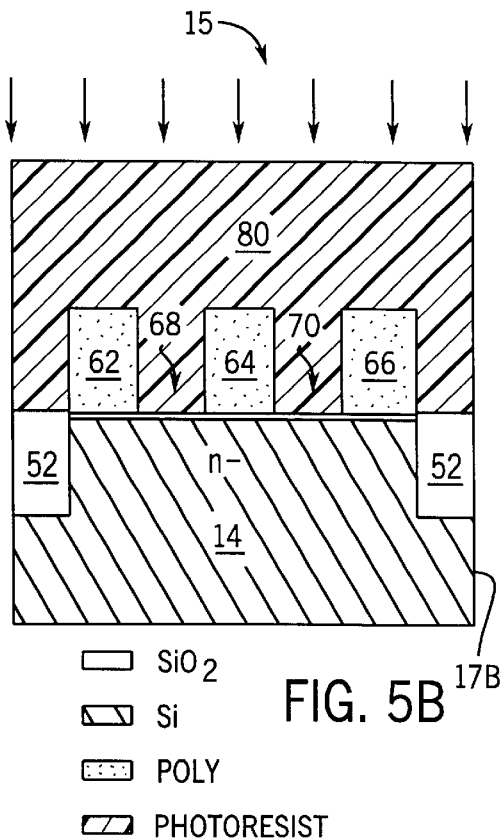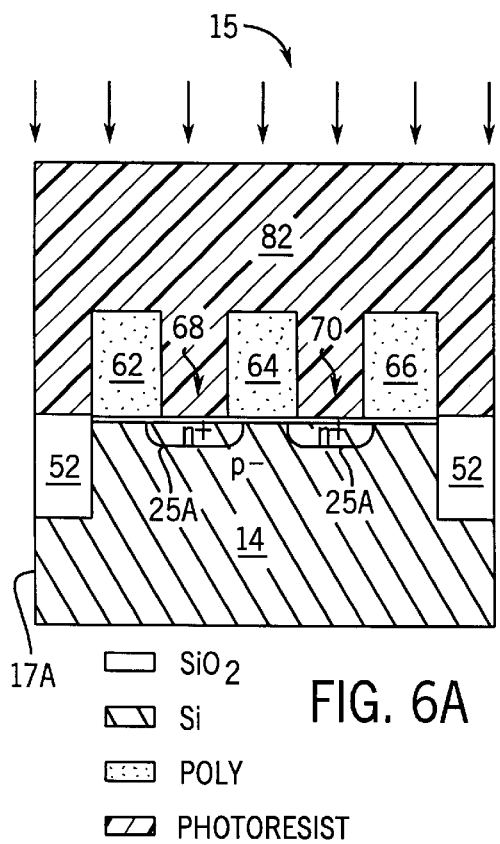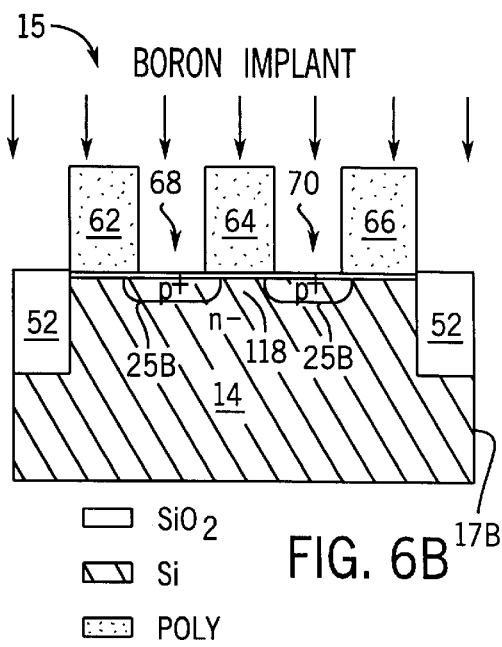

SELF-ALIGNED SOURCE AND DRAIN EXTENSIONS FABRICATED IN A DAMASCENE CONTACT AND GATE PROCESS

CROSS REFERENCE TO RELATED APPLICATIONS

This patent application is related to U.S. application Ser. No. 09/303,694, filed by Xiang et al., entitled "A High-K Gate Dielectric Process With Self Aligned Damascene Contact to Damascene Gate"; U.S. application Ser. No. 09/225,203, filed by Yu, entitled "Step Drain and Source Junction Formation"; U.S. application Ser. No. 09/255,604, filed by Yu, entitled "A Process for Forming Ultra-Shallow Source/ Drain Extensions"; and U.S. application Ser. No. 09/304,129, filed by Xiang et al., entitled "A High-K Gate Dielectric Process With Self Aligned Damascene Contact to Damascene Gate and a Low-K Interlevel Dielectric", all filed on an even date herewith and assigned to the assignee of the present invention. This patent application is also related to U.S. application Ser. No. 09/187,630, filed on Nov. 6, 1998, by Yu, entitled "Dual Amorphization Implant Process for Ultra-Shallow Drain and Source Extensions"; U.S. application Ser. No. 09/187,890, filed on Nov. 6, 1998, by Yu et al., entitled "A Method of Fabricating an Integrated Circuit with Ultra-Shallow Source/Drain Extension"; U.S. application Ser. No. 09/187,172, filed on Nov. 6, 1998, by Yu, entitled "Recessed Channel Structure for Manufacturing Shallow Source Drain Extension" and U.S. application Ser. No. 09/187,653, filed on Nov. 6, 1998, by Yu et al., entitled "A Damascene Process for Forming Ultra-Shallow Source/ Drain Extensions and Pocket in ULSI MOSFET", all assigned to the assignee of the present invention.

FIELD OF THE INVENTION

The present invention relates to integrated circuits (ICs) and methods of manufacturing integrated circuits. More particularly, the present invention relates to a method of manufacturing integrated circuits having transistors with ultra-shallow or shallow source/drain extensions.

BACKGROUND OF THE INVENTION

Integrated circuits (ICs), such as, ultra-large scale integrated (ULSI) circuits, can include as many as one million transistors or more. The ULSI circuit can include complementary metal oxide semiconductor (CMOS) field effect transistors (FETs). The transistors can include semiconductor gates disposed between drain and source regions. The drain and source regions are typically heavily doped with a P-type dopant (boron) or an N-type dopant (phosphorous).

The drain and source regions generally include a thin or shallow extension that is disposed partially underneath the gate to enhance the transistor performance. Shallow source and drain extensions help to achieve immunity to short-channel effects which degrade transistor performance for both N-channel and P-channel transistors. Short-channel effects are among the most important scaling issues for mainstream CMOS technology and can cause threshold voltage roll-off and drain-induced barrier lowering. Shallow source and drain extensions and, hence, controlling short-channel effects are particularly important as transistors become smaller.

Conventional techniques utilize a double implant process to form shallow source and drain extensions. According to the conventional process, the source and drain extensions are formed by providing a transistor gate structure without sidewall spacers on a top surface of a silicon substrate. The silicon substrate is doped on both sides of the gate structure via a conventional doping process, such as, a diffusion process or ion-implantation process. Without the sidewall spacers, the doping process introduces dopants into a thin region (i.e., just below the top surface of the substrate) to form the drain and source extensions, as well as to partially form the drain and source regions.

After the drain and source extensions are formed, silicon dioxide spacers, which abut lateral sides of the gate structure, are provided over the source and drain extensions. The substrate is doped a second time to form the deeper source and drain regions. The source and drain extensions are not further doped due to the blocking capability of the silicon dioxide spacer.

As transistors disposed on integrated circuits (ICs) become smaller, transistors with shallow and ultra-shallow source/drain extensions have become more difficult to manufacture. For example, smaller transistors should have ultra-shallow source and drain extensions (less than 30 nanometer (nm) junction depth). Forming source and drain extensions with junction depths of less than 30 nm is very difficult using conventional fabrication techniques.

Conventional ion-implantation and diffusion-doping techniques make transistors on the IC susceptible to short-channeling effects, which result in a dopant profile tail distribution that extends deep into the substrate. Also, conventional ion-implantation techniques have difficulty maintaining shallow source and drain extensions because point defects generated in the bulk semiconductor substrate during ion implantation can cause the dopant to more easily diffuse (transient enhanced diffusion, TED). The diffusion often extends the source and drain extensions vertically into the bulk semiconductor substrate.

As transistors disposed on integrated circuits (ICs) become smaller (e.g., transistors with gate lengths approaching 50 nm), CMOS fabrication processes have considered a two-dimensional channel-doping technique. A two-dimensional doping implant can form a channel-doping profile in the lateral direction that is non-uniform and a channel-doping profile in the vertical direction that is a super-steep, retrograded channel-doping profile. The two-dimensional channel-doping profile is critical to scaling (i.e., proportional operation and structural elements in the ultra-small dimensions of a sophisticated transistor).

The two-dimensional channel-doping profile is conventionally formed with deep pocket implants which surround the entire source and the entire drain. The implants have an opposite conductivity type to that of the source and drain and form a "halo-like" structure around the border of the source and drain. The halo-like structure increases the doping concentration near the junction of the source and drain. Increased doping concentration near the junction of source and drain degrades (i.e., increases) the source/drain junction capacitance (e.g., parasitic capacitance). Increased parasitic capacitance reduces the speed of the transistor.

Thus, shallow extensions and deep pocket implants are utilized to alleviate short-channel effects. However, the formation of shallow extensions is difficult as transistors become smaller, and pocket implants can adversely affect the speed of transistors when fabricated according to conventional processes.

Yet, another major problem associated with CMOS scaling is related to conventional gate dielectric materials disposed under the gate conductor. Generally, conventional gate dielectric materials, such as, silicon dioxide, are less reliable as transistor size is decreased. For example, silicon dioxide is subject to high leakage current caused by the "direct tunneling effect." Generally, as channel lengths approach 70 nanometers (nm) or less, high dielectric constant (k) dielectric materials must replace silicon dioxide dielectric materials.

High-k dielectric materials cannot be utilized in conventional CMOS processes due to the thermal instability associated with their molecular structure. High temperature treatments, such as, source/drain implantation activation annealing (typically 1050° C. for 10 seconds), can cause reactions between the high-K dielectric materials and silicon. Also, high-k dielectric materials can change phases (amorphous to crystalline) in response to the high temperature treatments. For example, one high k dielectric material, tantalum pentaoxide ($Ta_2O_5$), changes phase from an amorphous material to a crystalline material at approximately 800° C. Crystalline $Ta_2O_5$ material has a high leakage current.

Still another problem associated with CMOS scaling involves spacings between gate structures and contacts. Contacts are required in an IC device to provide electrical connections between layers or levels of the integrated circuit device. Semiconductor devices typically include a multitude of transistors that are coupled together in particular configurations through contacts.

Contacts are generally coupled to the source region and/or drain region of the transistors disposed on the integrated circuit. The contact is often connected to the source and drain regions via a silicide layer. The silicide layer is generally formed in a high temperature process. The silicide layer reduces drain/source series resistance.

In conventional processes, contacts must be spaced from the gate conductor by a minimum acceptable distance (often at least one minimum lithographic feature). Contacts must be spaced apart from the gate structure so alignment errors do not result in a shorting, in severe crosstalking, or in a stacked gate with the source contact or the drain contact. As lithographic feature sizes are reduced according to advanced fabrication processes, the spacing between the contacts and the gate structure becomes even more critical because slight alignment errors can cause a short circuit. The spacing between the contact and gate contributes to the overall size of the transistor and, hence, to the size of the IC.

Thus, there is a need for a process that prevents misalignment between the contact and gate and that allows the spacing between the contact and the gate to be reduced. Further, there is a need for a method of manufacturing shallow source and drain extensions that does not utilize a conventional double implant process. Even further still, there is a need for transistors that have shallow junction source and drain extensions that can utilize high-k dielectric materials.

SUMMARY OF THE INVENTION

The present invention relates to a process for fabricating an integrated circuit. The process includes forming a polysilicon pattern on a substrate, forming a shallow source region and a shallow drain region, depositing a material in a spacing associated with the shallow source region and in a spacing associated with the shallow drain region, removing the polysilicon pattern, and providing a photoresist over the gate region. The process further includes forming a deep source region and a deep drain region, removing the photoresist, and depositing a gate dielectric and a gate conductor over the gate region.

The present invention further relates to a method of fabricating an integrated circuit on a substrate including a shallow source region below a first insulative structure and a shallow drain region below a second insulative structure. The substrate has a first conductive structure separated from a second conductive structure by the first insulative structure. The substrate also has a third conductive structure separated from the second conductive structure by the second insulative structure. The second conductive structure is at a gate location. The method includes removing the first conductive structure and the third conductive structure, doping the substrate to form a deep source region and a deep drain region, removing the second conductive structure, and providing a gate conductor over the gate location.

The present invention is also related to a damascene method of fabricating an integrated circuit on a substrate. The substrate has a first conductive structure separated from a second conductive structure by a first space. The substrate also has a third conductive structure separated from the second conductive structure by a second space. The second conductive structure is at a gate location. The method includes steps of forming a shallow source region below the first space and a shallow drain region below the second space, depositing an insulative material in the first space and the second space, etching the first conductive structure and the third conductive structure, forming a deep source region and a deep drain region, etching the second conductive structure, and depositing a gate conductor over the gate location.

BRIEF DESCRIPTION OF THE DRAWINGS

Exemplary embodiments of the present invention will hereafter be described with reference to the accompanying drawings, wherein like numerals denote like elements, and:

FIG. 5A is a cross-sectional view of the portion of the integrated circuit illustrated in FIG. 1A, showing a shallow junction implant step for N-channel transistors;

FIG. 5B is a cross-sectional view of the portion of the integrated circuit illustrated in FIG. 1B, showing the shallow junction implant step for N-channel transistors;

FIG. 6A is a cross-sectional view of the portion of the integrated circuit illustrated in FIG. 1A, showing a shallow junction implant step for P-channel transistors;

FIG. 6B is a cross-sectional view of the portion of the integrated circuit illustrated in FIG. 1B, showing the shallow junction implant step for P-channel transistors;

DETAILED DESCRIPTION OF THE PREFERRED EXEMPLARY EMBODIMENTS

FIGS. 1A–13B illustrate an advantageous complementary metal oxide semiconductor (CMOS) fabrication damascene process for forming P-channel and N-channel transistors on a substrate. FIGS. 1A–13A show the process associated with a portion of the integrated circuit including an N-channel transistor. FIGS. 1B–13B show the process with respect to a portion of the integrated circuit including a P-channel transistor. The advantageous process and transistor structure are described below with reference to FIGS. 1A–13B as follows.

Figure 1A:
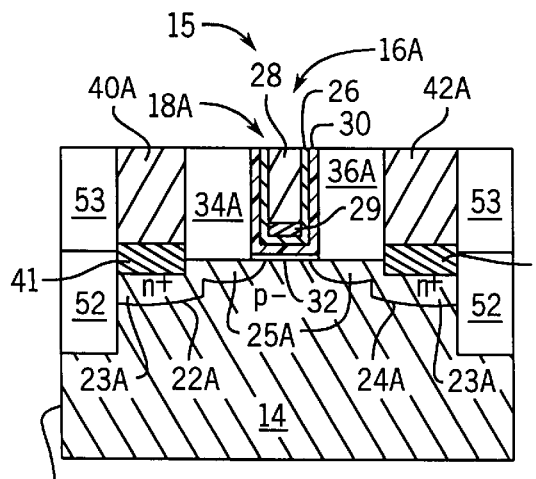
FIG. 1A is a cross-sectional view of a portion of an integrated circuit, including an N-channel transistor with shallow source/drain extensions in accordance with an exemplary embodiment of the present invention.
Figure 1B:
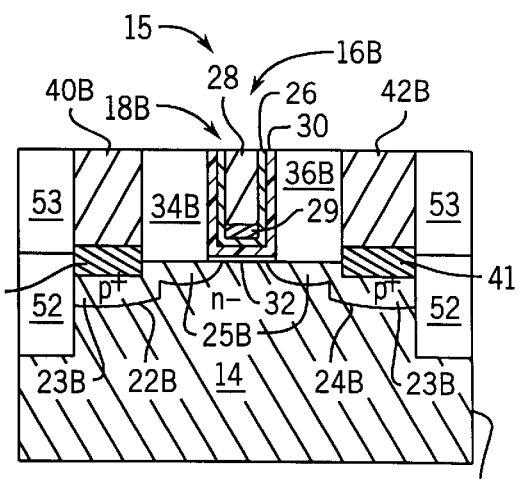
FIG. 1B is a cross-sectional view of a portion of the integrated circuit, including a P-channel transistor with shallow source/drain extensions in accordance with another exemplary embodiment of the present invention.

With reference to FIGS. 1A and 1B, an integrated circuit 15 includes an N-channel transistor 16A (FIG. 1A) disposed on a portion 17A of semiconductor substrate 14 and a P-channel transistor 16B (FIG. 1B) disposed on a portion 17B of semiconductor substrate 14. Portion 17A is preferably within a p-well or p-type region (p-) of substrate 14. Alternatively, entire substrate 14 can be lightly doped with p-type dopants (p-). Substrate 14 associated with portion 17B is lightly doped with n-type dopants (n-). Portion 17B is preferably part of an n-well or n-type region (n-) associated with substrate 14.

Semiconductor substrate 14 is preferably a single crystal silicon material, such as, a single crystal silicon wafer. Transistors 16A and 16B can be field effect transistors, such as, metal oxide semiconductor field effect transistors (MOSFETs). Transistors 16A and 16B preferably have gate lengths which are less than 100 nm (e.g. approaching 50 nm) and are part of an ultra-large scale integrated (ULSI) circuit that includes 1,000,000 or more transistors. Transistors 16A and 16B are provided between insulative structures 52. The lateral dimension (e.g., left to right in FIGS. 1A–13B) between structures 52 is preferably less than 1000 nm (e.g. 400–600 nm).

Transistor 16A includes a gate stack or structure 18A, a source region 22A, and a drain region 24A. Transistor 16B includes a gate stack or structure 18B, a source region 22B, and a drain region 24B. Regions 22A and 24A include deep regions 23A and shallow regions 25A. Regions 22B and 24B include deep regions 23B and shallow regions 25B. Shallow regions 25A and 25B act as source/drain extensions for transistors 18A and 18B, respectively, which help transistors 16A and 16B achieve substantial immunity to short-channel effects. Short channel effects can degrade performance of transistors 16A and 16B, as well as the manufacturability of the IC associated with transistors 16A and 16B.

Regions 25A and 25B can be ultra-shallow extensions (e.g., junction depths of less than 30 nm), which are thinner than deep regions 23A and 23B. However, regions 25A and 25B can be deeper than 30 nm. Regions 25A and 25B are preferably 10–40 nm deep and 90–130 nm wide.

Regions 23A and 23B are preferably 100 nm (80–250 nm) deep and 80–140 wide. Regions 22A and 24A have a concentration of $10^{19-21}$ n-type dopants per $cm^3$, and regions 22B and 24B have a concentration of $10^{19-21}$ p-type dopants per $cm^3$. N-type dopants can be phosphorus (P), arsenic (As), or other dopant, and p-type dopants can be boron (B), boron difluoride ($BF_2$), or other dopant.

Gate structures 18A and 18B are preferably 100–300 nm high and 80–120 nm wide and include a metal conductor 26, a metal layer or plug 28, a high dielectric constant (k) dielectric layer 30, a metal layer 29, and a gate oxide buffer layer 32. Conductor 26 is preferably a 20–40 nm thick conformal layer of titanium nitride (TiN). Plug 28 is preferably a 50–250 nm thick layer of tungsten (W). Layer 30 is preferably a 2–10 nm thick conformal layer of tantalum pentaoxide ($Ta_2O_5$) or titanium dioxide ($TiO_2$). Layer 29 is preferably an 8–12 nm thick layer of metal, such as, nickel (Ni). Layer 32 is preferably a 4–8 nm thick layer of thermally grown silicon dioxide or deposited silicon nitride ($Si_3N_4$). Alternatively, layer 26, plug 28, and layer 29 can be replaced with other conductive or semiconductive materials.

Gate stack structure 18A is disposed between an insulative structure 34A and an insulative structure 36A. Gate structure 18B is disposed between an insulative structure 34B and an insulative structure 36B. A contact 40A is provided over source region 22A, and a contact 42A is provided over a drain region 24A. A contact 40B is provided over source region 22B, and a contact 42B is provided over drain region 24B. Preferably, contacts 40A, 42A, 40B, and 42B are provided over deep regions 23A and 23B, respectively.

Contacts 40A, 42A, 40B, and 42B each include a silicide layer 41. Layer 41 is preferably a 20–30 nm thick layer of nickel silicide. Alternatively, other metals, silicides, or conductive layers can be utilized.

Insulative structures 34A, 34B, 36A, and 36B serve as an insulative spacer for gate structures 18A and 18B. Structures 34A, 34B, 36A, and 36B are preferably 80–120 nm wide and 100–300 nm high and provide isolation between contacts 40A and 42A and gate structure 18A and between contacts 40B and 42B and gate structure 18B. Structures 34A, 34B, and 36A, and 36B can be conformally deposited by a chemical vapor deposition (CVD) tetraorthosilicate (TEOS) process and etched back to leave the particular structures for transistors 16A and 16B. Alternatively, structures 34A, 34B, 36A, and 36B can be other insulative materials, such as, silicon nitride ($Si_3N_4$). Insulative structures 53, which are similar to structures 34A, 34B, 36A, and 36B, can be provided over structures 52.

In accordance with another exemplary embodiment of the present invention, insulative structures 34A, 34B, 36A, and 36B can be low-k materials. Low-k materials advantageously reduce capacitive effects associated with contacts 40A, 40B, 42A, and 42B, as well as structures 53. The low-k materials (k less than 3, preferably less than 2) can be created from vapor deposition and spin-on coating techniques. For example, vapor deposition of parylene and polynapthalene families of polymers and polytetrafluoroethylene (PTFE) can be utilized to form low-k materials. Alternatively, plasma enhanced chemical vapor deposition (PECVD) and high density plasma CVD of fluorinated SiO2 glass, and amorphous C:F can form the low-k dielectric material. Air gap formation and plasma polymerization of pentafluorostyrene and pulse plasma polymerization of PTFE can also be utilized. Additionally, materials can be deposited by spin coating; spin coating materials include organic polymers (fluorinated or non-fluorinated), inorganic polymers (nonporous), inorganic-organic hybrids, or porous materials (xerogels or aerogels). Low-k material synthesis is described in an article entitled "Low-Dielectric-Constant Materials for ULSI Interlayer Dielectric Applications", by Wei William Lee and Paul S. Ho, *MRS Bulletin* (October, 1997), pages 19–23.

Figure 2A:
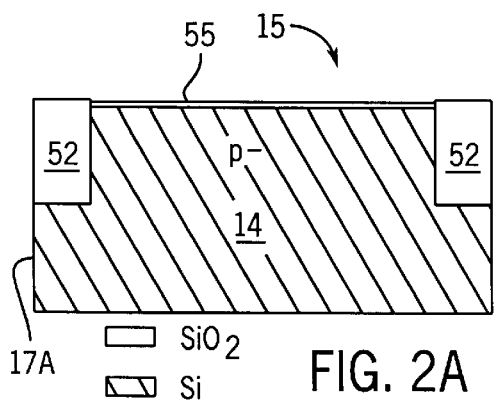
FIG. 2A is a cross-sectional view of the portion of the integrated circuit illustrated in FIG. 1A, showing a shallow trench isolation step.
Figure 2B:
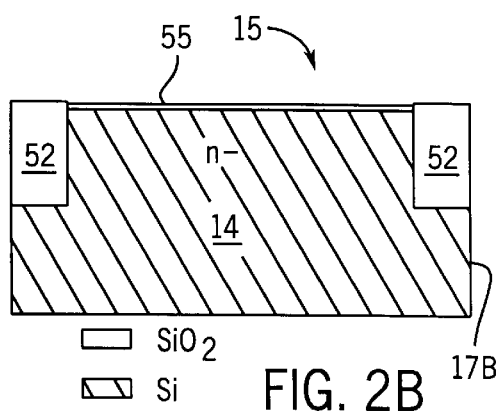
FIG. 2B is a cross-sectional view of the portion of the integrated circuit illustrated in FIG. 1B, showing the shallow trench isolation step.

With reference to FIGS. 1A–13B, the fabrication of integrated circuit 15 is described below as follows. In FIGS. 2A and 2B, portions 17A and 17B include structures 52, which are formed by conventional shallow trench isolation (STI) technique. Alternatively, other isolation techniques, including local oxidation of silicon (LOCOS) techniques, can be utilized to form isolation structures 52. Additionally, well implantation, punch-through implantation, and threshold-adjustment implantation are provided to substrate 14 in accordance with conventional processes. Substrate 14 also includes a pad layer or oxide layer 55 that is thermally grown on substrate 14. Layer 55 preferably has a thickness of 2–5 nm.

Figure 3A:
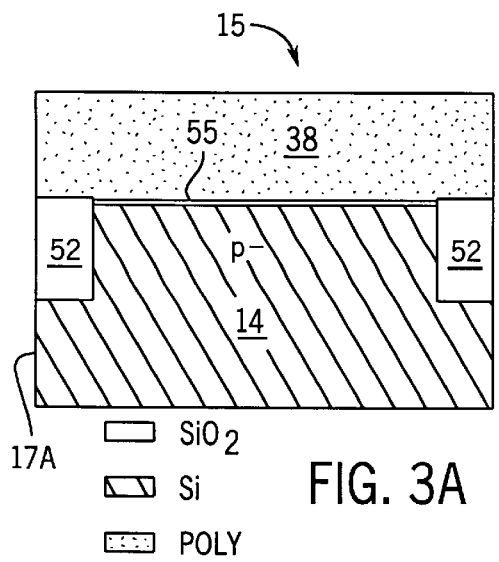
FIG. 3A is a cross-sectional view of the portion of the integrated circuit illustrated in FIG. 1A, showing a polysilicon deposition step.
Figure 3B:
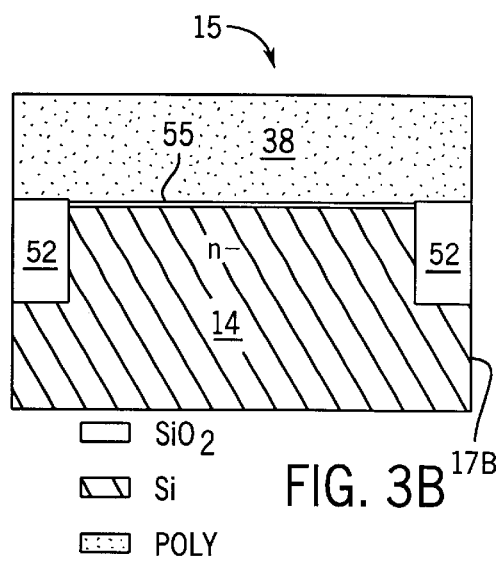
FIG. 3B is a cross-sectional view of the portion of the integrated circuit illustrated in FIG. 1B, showing the polysilicon deposition step.

With reference to FIGS. 3A and 3B, a conductive layer 38 is deposited over oxide layer 55. Layer 38 is preferably 100–300 nm thick and is utilized as a mask to define insulative structures 34A, 34B, 36A, and 36B, contacts 40A, 40B, 42A, and 42B, and gate structures 18A and 18B. Layer 38 can be a doped or undoped polysilicon layer deposited by plasma enhanced chemical vapor deposition (PECVD). Alternatively, other deposition techniques and conductive materials can be utilized.

Figure 4A:
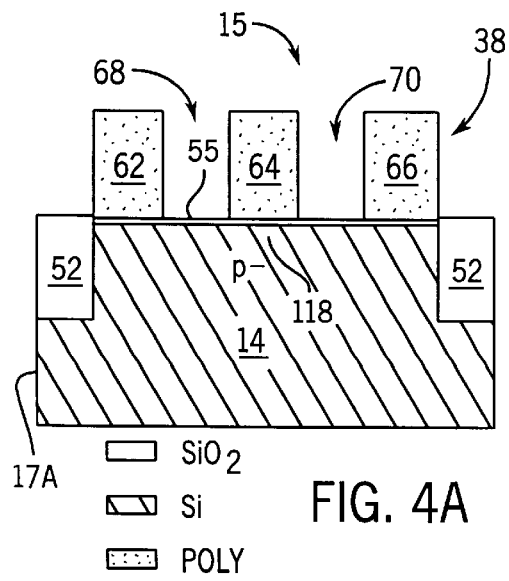
FIG. 4A is a cross-sectional view of the portion of the integrated circuit illustrated in FIG. 1A, showing a polysilicon patterning step.
Figure 4B:
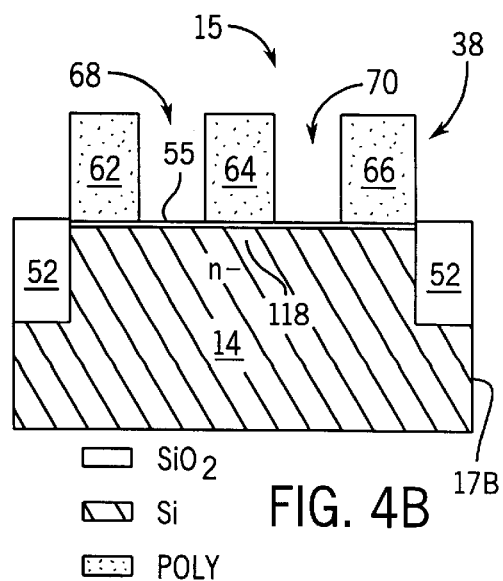
FIG. 4B is a cross-sectional view of the portion of the integrated circuit illustrated in FIG. 1B, showing the polysilicon patterning step.

In FIGS. 4A and 4B, conductive layer 38 is selectively etched in a photolithographic process to form structures 62, 64, and 66. Structures 62, 64, and 66 preferably have a width of 80–120 nm and are formed in a deep ultraviolet lithographic process that utilizes a plasma dry etch. Structures 62, 64, and 66 can have a width of less than one minimum lithographic feature by overetching or trim etching.

Structures 62, 64, and 66 define a hole or space 68 and a hole or space 70. Structure 64 is associated with a gate region 118. Space 68 is associated with source extensions (shallow region 25A of source region 22A and shallow region 25B of source region 22B, FIGS. 1A and 1B), and space 70 is associated with drain extensions (shallow region 25A of drain region 24A and shallow region 25B of drain region 24B, FIGS. 1A and 1B). The polysilicon pattern associated with structures 62, 64, and 66 is formed by providing a photoresist mask and selectively etching layer 38 on substrate 14 to form spaces 68 and 70.

With reference to FIGS. 5A and 5B, substrate 14 undergoes a self-aligned N-MOS implant to provide shallow regions 25A beneath spaces 68 and 70 of portion 17A. Portion 17B, including spaces 68 and 70 and structures 62, 64, and 66, is completely covered by a photolithographic or photoresist mask 80. Mask 80 does not cover portion 17A. Mask 80 protects portion 17B of substrate 14 (underneath mask 80) from the N-MOS implant. Since portion 17B is typically on the same substrate 14 as portion 17A, portion 17B is subjected to similar processing unless masked.

Regions 25A can be formed by implanting phosphorous (P) or Arsenic (As) (or other n-type dopant) to a depth of 10–40 nm with low energy (1–10 KeV (kiloelectron volts)) at a dose of $5 \times 10^{14}$–$2 \times 10^{15}$ dopants per centimeter squared ($cm^2$) and annealing. Annealing can include rapid thermal annealing (RTA), laser annealing, or pulse annealing. Alternatively, arsenic can be utilized at lower energy levels (5 KeV or less).

The N-MOS implant can be provided at a 90° angle or other angle to form regions 25A. Dopants associated with the N-MOS implant can laterally diffuse a distance of 30–60 percent of the junction depth within substrate 14. Regions 25A preferably have a concentration of $10^{19-21}$ dopants per centimeter cubed.

Additionally, other implants can be provided to portion 17A. For example, a halo or pocket implants or other dopant-profile engineering techniques can be provided through spaces 68 and 70. Preferably, halo or pocket implants are provided before the N-MOS implant to form a two-dimensional channel-doping profile. The halo implant provides p-type dopants through spaces 68 and 70 of portion 17A to a depth below regions 25A (preferably below regions 23A). The halo implant is advantageously confined by spaces 68 and 70 so the resulting pocket regions do not adversely affect regions 25A and do not increase junction capacitance. After doping, layer 80 (FIG. 5B) is removed by an etching, stripping, or other removal process.

With reference to FIGS. 6A and 6B, a self-aligned P-MOS implant is provided to substrate 14 to provide shallow regions 25B beneath spaces 68 and 70 of portion 17B. Portion 17A, including spaces 68 and 70 and structures 62, 64, and 66, is completely covered by a photolithographic or photoresist mask 82. Mask 82 does not cover portion 17B. Mask 82 protects portion 17A of substrate 14 (underneath mask 82) from the P-MOS implant.

Regions 25B can be formed by implanting boron (B) to a depth of 10–40 nm (or other p-type dopant) with a low energy (1–10 KeV) at a dose of $5 \times 10^{14}$–$2 \times 10^{16}$ dopants per cm squared and by annealing. Annealing can include RTA, laser annealing, or pulse annealing. Alternatively, boron difluoride ($BF_2$) can be utilized as a p-type dopant at lower energy levels (5 KeV or less). Regions 25B preferably have a concentration of $10^{19-21}$ dopants per centimeter cubed.

Additionally, other implants can be provided to portion 17B. For example, halo or pocket implants or other dopant-profile engineering techniques can be provided through spaces 68 and 70. Preferably halo or pocket implants are provided before the P-MOS implant to form in a two-dimensional doping-profile. The halo implant provides n-type dopants through spaces 68 and 70 of portion 17B to a depth below regions 25B (preferably below regions 23B). The halo implant is advantageously confined by spaces 68 and 70 so the resulting pocket regions do not adversely affect regions 25B and do not increase junction capacitance.

The P-MOS implant can be performed at a 90° angle or other angle to form regions. Dopants associated with the P-MOS implant laterally diffuse a distance of 30–60 percent of the junction depth within substrate 14. Regions 23B have a concentration of $10^{19-21}$ p-type dopants per $cm^3$. Alternatively, the P-MOS implant described with reference to FIGS. 6A–B can be performed before the NMOS implant described with reference to FIGS. 5A and 5B.

Figure 7A:
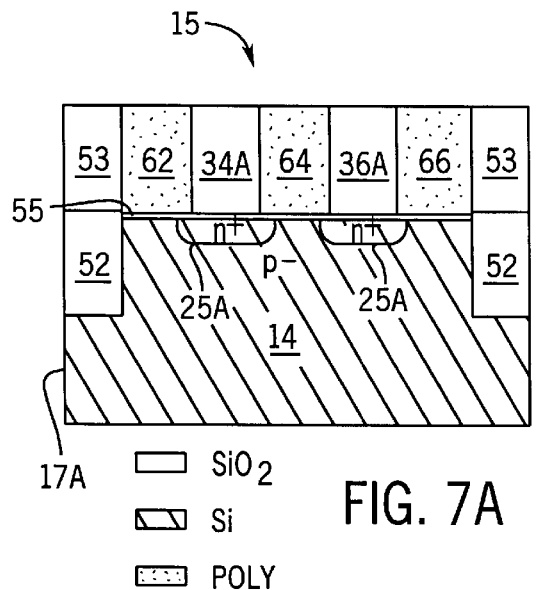
FIG. 7A is a cross-sectional view of the portion of the integrated circuit illustrated in FIG. 1A, showing a silicon dioxide deposition and chemical mechanical polish step.
Figure 7B:
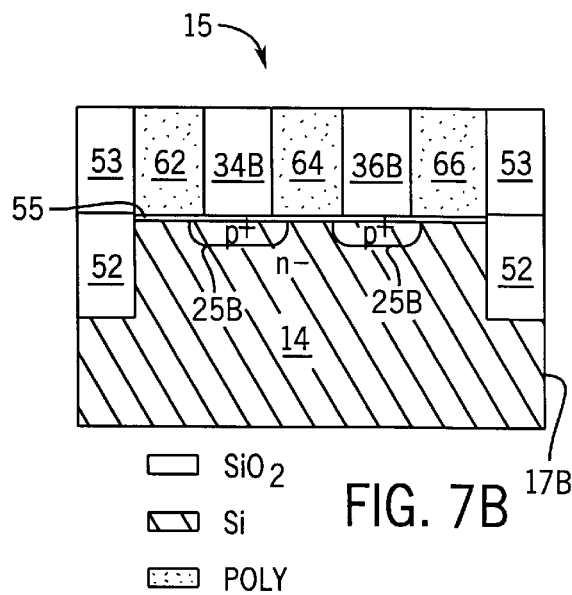
FIG. 7B is a cross-sectional view of the portion of the integrated circuit illustrated in FIG. 1B, showing the silicon dioxide deposition and chemical mechanical polish step.

With reference to FIGS. 7A and 7B, layer 82 (FIGS. 6A and 6B) is removed and an insulative layer is deposited in a conformal deposition process to fill spaces 68 and 70. The insulative layer is subject to a chemical mechanical polish (CMP) to leave insulative structures 34A and 34B and insulative structures 36A and 36B in spaces 68 and 70, respectively, and structures 53 above structures 52. Alternatively, other space-filling techniques can be utilized to provide insulative material in spaces 68 and 70 (FIGS. 6A and 6B).

Preferably, the insulative layer associated with structures 34A, 34B, 36A, 36B is deposited in a TEOS process by CVD. Insulative structures 34A, 34B, 36A, 36B can be silicon dioxide or silicon nitride. Structures 34A, 34B, 36A, 36B are shown including layer 55 for simplicity. According to another alternative embodiment of the present invention, a low-k dielectric material is utilized. The low-k dielectrical material is preferably hydrogen silsesquioxane (HSQ), spin-on-glass (SOG), or benzocyclobutene (BCB). Low-k dielectric materials are discussed with reference to FIGS. 1A and 1B.

Figure 8A:
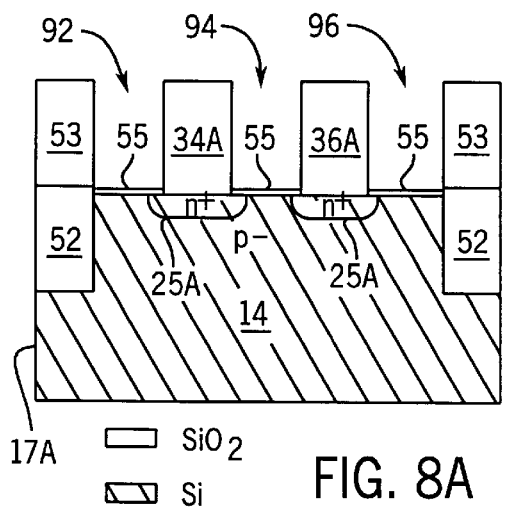
FIG. 8A is a cross-sectional view of the portion of the integrated circuit illustrated in FIG. 1A, showing a polysilicon removal step.
Figure 8B:
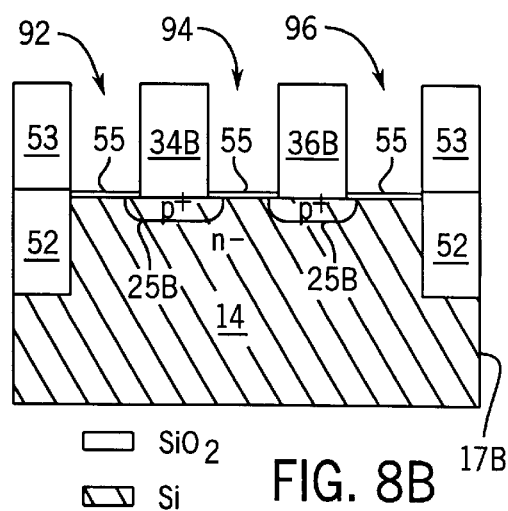
FIG. 8B is a cross-section view of the portion of the integrated circuit illustrated in FIG. 1B, showing the polysilicon removal step.

With reference to FIGS. 8A and 8B, conductive structures 62, 64 and 66 are removed from portions 17A and 17B, leaving holes or spaces 92, 94, and 96. Layer 55 remains in spaces 92, 94, and 96. Layer 55 is not shown beneath structures 34A, 34B, 36A and 36B because layer 55 merges with the silicon dioxide material of structures 34A, 34B, 36A and 36B. Spaces 92, 94, and 96 are preferably 80–120 nm wide. Spaces 92, 94, and 96 can be less than one lithographic feature. Conductive structures 62, 64, and 66 can be removed in an isotropic dry-etching or chemical wet-etching process selective to polysilicon with respect to silicon dioxide.

Figure 9A:
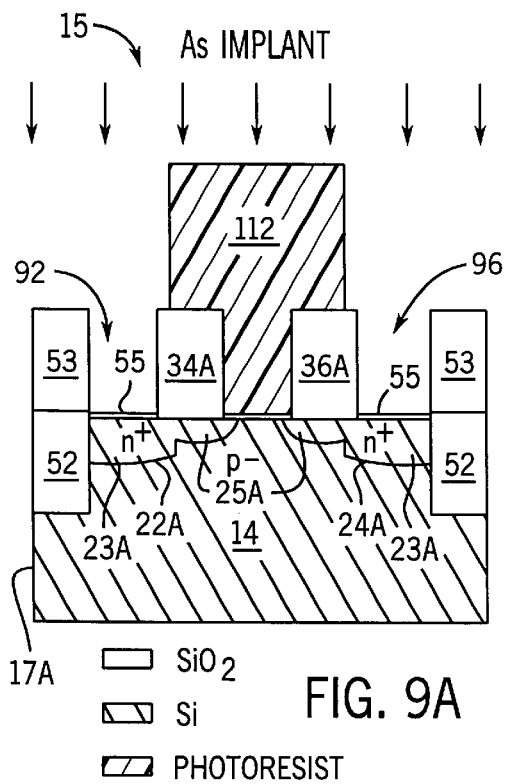
FIG. 9A is a cross-sectional view of the portion of the integrated circuit illustrated in FIG. 1A, showing a deep source/drain implantation step for N-channel transistors.
Figure 9B:
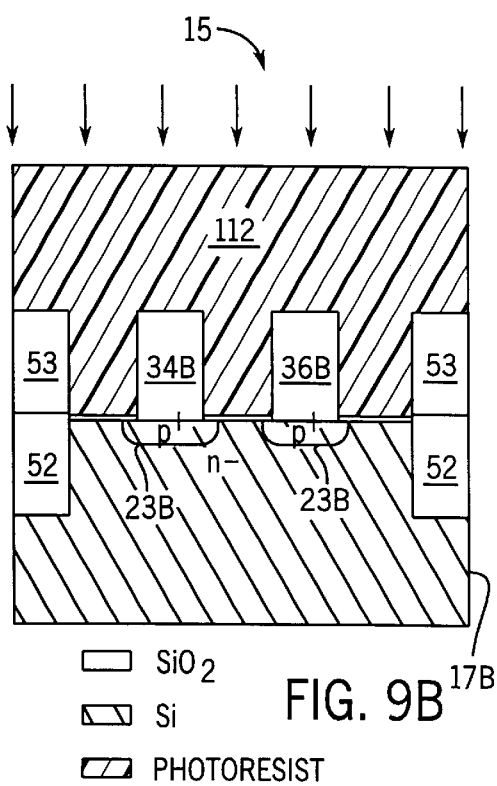
FIG. 9B is a cross-sectional view of the portion of the integrated circuit illustrated in FIG. 1B, showing the deep source/drain implantation step for N-channel transistors.

With reference to FIGS. 9A and 9B, portion 17B is completely covered by a photolithographic or photoresist mask 112 and spaces 94 of portion 17A is covered by mask 112. Mask 112 is selectively etched in a photolithographic process to leave mask 112 in opening 94 but not in spaces 92 and 96 of portion 17A.

After mask 112 is selectively etched or patterned, substrate 14 is subjected to an n+ source/drain junction implant to form deep regions 23A beneath spaces 92 and 96. Regions 23A preferably have a concentration of $10^{19-21}$ n-type dopants per $cm^3$. Preferably, arsenic dopants at a dose of $5 \times 10^5$ dopants per $cm^2$ are accelerated at an energy of 15–25 KeV to substrate 14. Regions 23A extend to a depth of 100 nm into substrate 14. Mask 112 protects portion 17B and is removed after the n– source/drain junction implant.

Figure 10A:
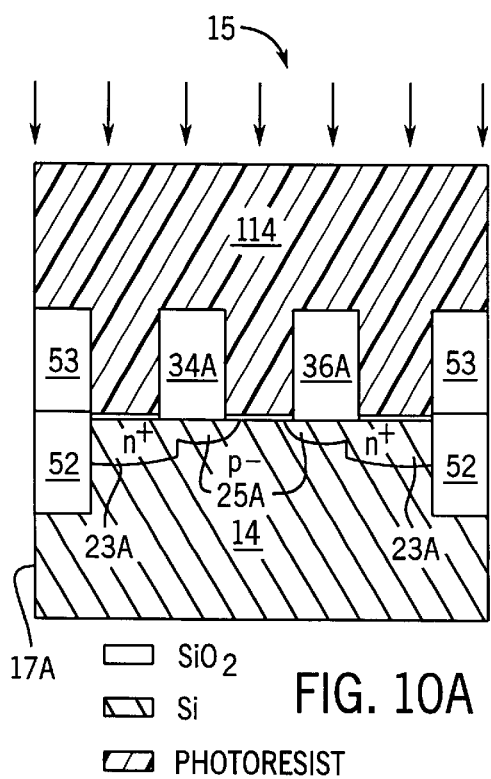
FIG. 10A is a cross-sectional view of the portion of the integrated circuit illustrated in FIG. 1A, showing a deep source/drain junction implant step for P-channel transistors.
Figure 10B:
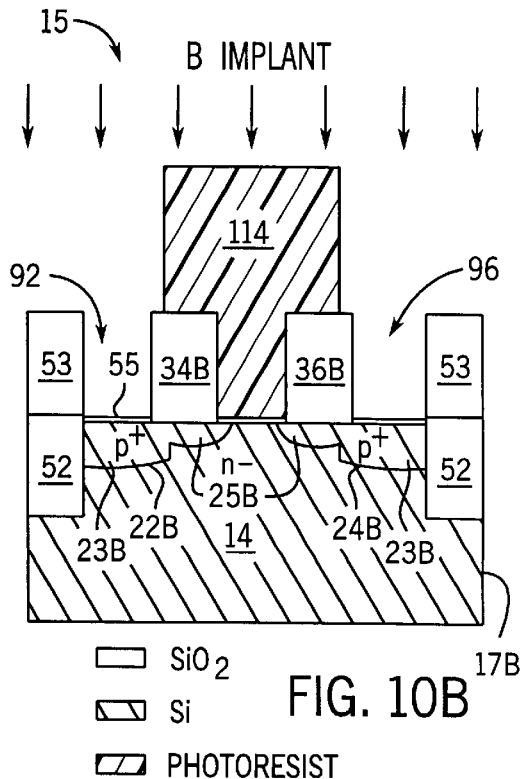
FIG. 10B is a cross-sectional view of the portion of the integrated circuit illustrated in FIG. 1B, showing the deep source/drain junction implant step for P-channel transistors.

With reference to FIGS. 10A and 10B, portion 17A is completely covered by photolithographic or photoresist mask 114. Opening 94 of portion 17B is also covered by mask 114. Mask 114 is selectively etched in a photolithographic process to leave mask 114 in space 94 but not in spaces 92 and 96 of portion 17B.

After mask 114 is selectively etched or patterned, substrate 14 is subjected to a p+ source/drain junction implant to form deep regions 23B beneath spaces 92 and 96. Regions 23B preferably have a concentration of $10^{19-21}$ n-type dopants per $cm^3$. Preferably, boron difluoride dopants at a dose of $1-5 \times 10^{15}$ dopants per $cm^2$ are accelerated at an energy level of 15–25 KeV to substrate 14. Regions 23B extend to a depth of 100 nm into substrate 14. Mask 114 protects portion 17A and is removed after the p-source/drain junction implant. Alternatively, the p+ source/drain junction implant described with reference to FIGS. 10A and 10B can be performed before the n+ source/drain junction implant described with reference to FIGS. 9A and 9B.

Figure 11A:
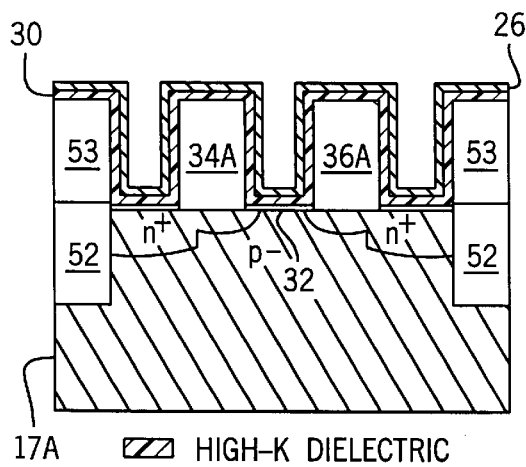
FIG. 11A is a cross-sectional view of the portion of the integrated circuit illustrated in FIG. 1A, showing a gate dielectric and gate metal deposition step.
Figure 11B:
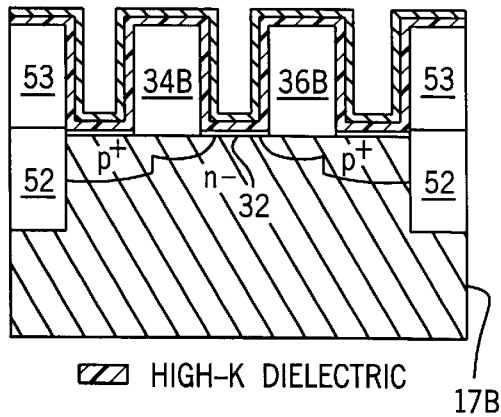
FIG. 11B is a cross-sectional view of the portion of the integrated circuit illustrated in FIG. 1B, showing the gate dielectric and gate metal deposition step.

With reference to FIGS. 11A and 11B, after mask 114 is removed, a rapid thermal anneal (RTA) is provided to activate implants in regions 23A, 25A, 23B, and 25B of portions 17A and 17B. Layer 55 is removed and a gate oxide formation process is performed. The gate oxide process includes forming a gate oxide buffer layer 32. The gate oxide buffer layer 32 is thermally grown in an $O_2$ or $NO_2$ process to a thickness of 4–8 Angstroms and is preferably silicon dioxide.

Layer 32 improves the interface between material 30 and substrate 14. High-k dielectric layer 30 is deposited by CVD over portions 17A and 17B. High-k dielectric layer 30 can be a 20–40 nm thick layer of amorphous $Ta_2O_5$ material. Layer 30 is preferably conformally deposited in a metal organic CVD process after the RTA step to prevent crystallization of amorphous $Ta_2O_5$ material. After layer 30 is deposited, a 30–40 nm thick layer of metal conductor 26 is conformally deposited by CVD. Metal conductor 26 is preferably TiN. Alternatively, conductor 26 can be polysilicon or a metal.

Figure 12A:
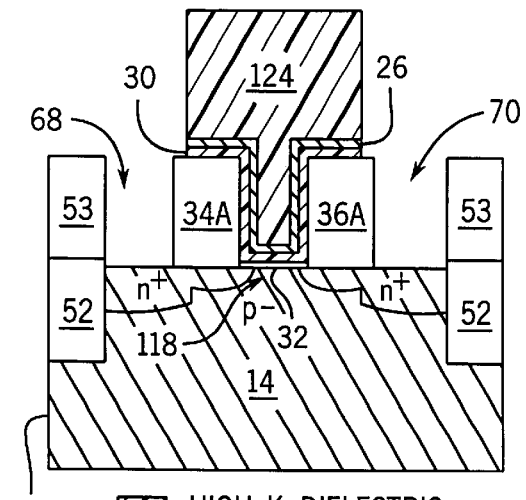
FIG. 12A is a cross-sectional view of the portion of the integrated circuit illustrated in FIG. 1A, showing a gate metal removal step.
Figure 12B:
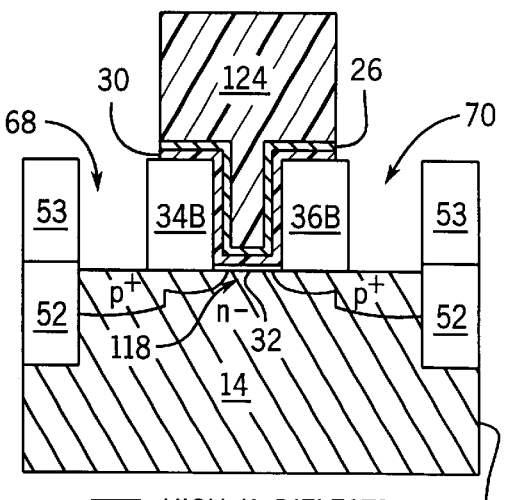
FIG. 12B is a cross-sectional view of the portion of the integrated circuit illustrated in FIG. 1B, showing the gate metal removal step.

With reference to FIGS. 12A and 12B, layers 30 and 32 and conductor 26 are selectively etched from spaces 68 and 70. A photolithographic process utilizing layer 124 above gate region 118 preserves layers 30 and 32 and conductor 26 above gate region 118 (e.g., in space 94 in FIGS. 8A–10B).

Figure 13A:
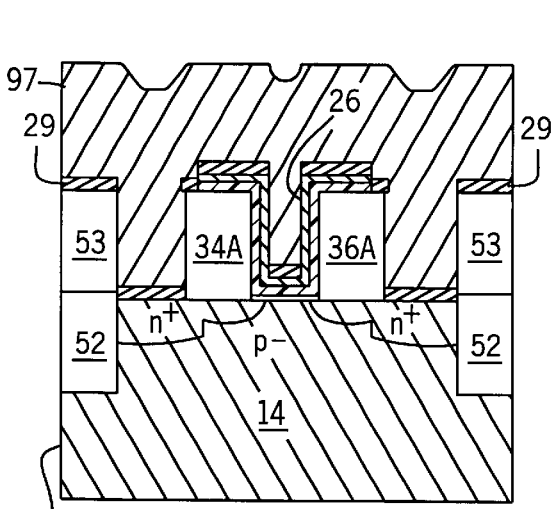
FIG. 13A is a cross-sectional view of the integrated circuit illustrated in FIG. 1A, showing a nickel deposition step.
Figure 13B:
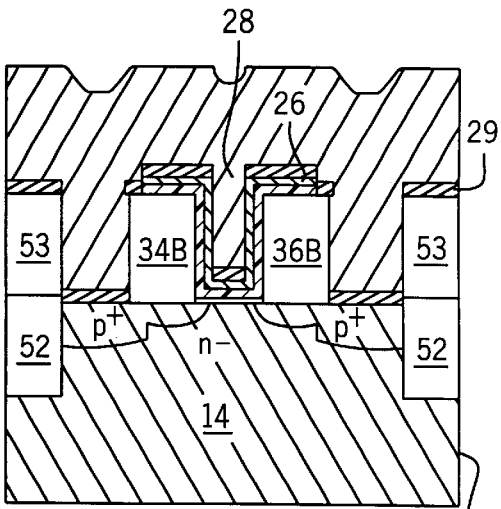
FIG. 13B is a cross-sectional view of the integrated circuit illustrated in FIG. 1B, showing the nickel deposition step.

With reference to FIGS. 13A and 13B, mask 124 is removed. After mask 124 is removed, a nickel sputtering process is provides layer 29 (a nickel layer) as an 8–12 nm thick layer within spaces 68 and 70 (FIG. 12) and above conductor 26 and insulator structure 53. Alternatively, other refractory metals can be utilized.

A nickel silicidation process is utilized to form silicided layers above regions 23A and 23B. The nickel silicidation process includes RTA at temperatures of 500–600° C. Sixty-percent (5–8 nm) of the thickness of layer 29 consumes substrate 14. The low temperature associated with the nickel silicidation process advantageously does not affect layer 30. The silicidation process forms a mononickel-silicide, which reduces contact resistance.

After layer 29 is provided, plug 28 is deposited by CVD as a tungsten layer 97 on top of layer 29. Alternatively, refractory metals other than tungsten can be deposited. Layer 97 is utilized for contacts 40A, 40B, 42A, and 42B, as well as plug 28. After deposition of layer 97, substrate 14 is subjected to CMP until a top surface of structures 34A, 36A, 34B, and 36B is reached.

The advantageous method of the present invention provides self-aligned shallow source and drain extensions. Self aligned contacts 40B and 42B are formed, as well as self-aligned gate structures 18A and 18B and self-aligned source/drain extensions (regions 25A and 25B). The self-aligned nature of contacts 40A, 42A, 40B, and 42B reduce the required lithographic spacing between structures 18A and 18B and contacts 40B and 42B.

It is understood that, while preferred embodiments, examples, materials, and values are given, they are for the purpose of illustration only. The apparatus and method of the invention are not limited to the precise details and conditions disclosed. For example, although a high-k dielectric material is mentioned, other materials can be utilized. Thus, changes may be made to the details disclosed without departing from the spirit of the invention, which is defined by the following claims.

What is claimed is:

1. A process for fabricating an integrated circuit, comprising:
   (a) forming a polysilicon masking pattern on a substrate, the masking pattern having a first spacing between a gate region and a first contact region and a second spacing between the gate region and a second contact region, the polysilicon masking pattern covering the gate region, the first contact region, and the second contact region;
   (b) forming a shallow source region below the first spacing and a shallow drain region below the second spacing;
   (c) depositing an insulative material in the first spacing and the second spacing;
   (d) removing the polysilicon masking pattern, thereby leaving the insulative material in the first spacing and the second spacing and exposing the substrate at the first contact region and the second contact region;
   (e) providing a photoresist over the gate region;
   (f) forming a deep source region at the first contact region and a deep drain region at the second contact region;
   (g) removing the photoresist; and
   (h) depositing a gate dielectric and a gate conductor over the gate region.

2. The process of claim 1, wherein the gate dielectric is a high-k gate dielectric, and a rapid thermal-annealing step is performed before the depositing a gate dielectric step to activate dopants in the deep source and deep drain regions.

3. The process of claim 1, wherein step (h) comprises:
   depositing the gate dielectric and gate conductor over regions of the first and second spacings; and
   removing the gate dielectric and the gate conductor from the regions of first spacing and the second spacing.

4. The process of claim 3, further comprising:
   depositing a nickel material as at least part of the gate conductor over the first spacing and the second spacing.

5. The process of claim 1, wherein the gate dielectric is a high-k gate dielectric layer.

6. The process of claim 4, wherein the nickel material is removed by a chemical mechanical process until the insulative material in the first spacing and the second spacing is reached.

7. The process of claim 1, wherein the gate dielectric is $Ta_2O_5$.

8. A method of fabricating an integrated circuit on a substrate including a shallow source region below a first insulative structure and a shallow drain region below a second insulative structure, the substrate having a first conductive structure separated from a second conductive structure by the first insulative structure, the substrate having a third conductive structure separated from the second conductive structure by the second insulative structure, the second conductive structure being at a gate location, the method comprising:
   removing the first conductive structure and the third conductive structure to expose a first substrate region and a third substrate region;
   doping the substrate to form a deep source region and a deep drain region within the first substrate region and the third substrate region;
   removing the second conductive structure to expose a second substrate region; and
   providing a gate conductor over the second substrate region corresponding to the gate location.

9. The method of claim 8, wherein the gate conductor is also provided over the first substrate region and the third substrate region.

10. The method of claim 9, further comprising:
    selectively removing the gate conductor from above the first substrate region and the third substrate region.

11. The method of claim 10, further comprising:
    depositing a metal material to fill a first recess over the first substrate region and a second recess over the third substrate region.

12. The method of claim 11, wherein the first conductive structure, second conductive structure, and third conductive structure include polysilicon.

13. The method of claim 8, wherein a gate dielectric of $Ta_2O_5$ is deposited before the gate conductor.

14. The method of claim 8, wherein the first conductive structure and the third conductive structure comprise polysilicon, and the first insulative structure and the second insulative structure comprise silicon dioxide.

15. The method of claim 8, further comprising:
    thermally annealing the substrate after the doping step and before the providing step.

16. A damascene method of fabricating an integrated circuit on a substrate, the substrate having a first conductive structure separated from a second conducive structure by a first space, the substrate having a third conductive structure separated from the second conductive structure by a second space, the second conductive structure being at a gate location, the method comprising steps of:
    forming a shallow source region below the first space and a shallow drain region below the second space;
    depositing an insulative material in the first space and the second space;
    removing the first conductive structure and the third conductive structure;
    forming a deep source region and a deep drain region in regions of the substrate exposed by the removing step;
    removing the second conductive structure; and
    depositing a gate conductor over the gate location.

17. The process of claim 16, wherein a gate dielectric is deposited before the gate conductor.

18. The process of claim 17, wherein the gate conductor is a metal.

19. The process of claim 16, wherein the shallow source region is less than 70 nanometers deep.

20. The process of claim 16, wherein the first space is a minimum lithographic feature.

* * * * *